United States Patent
Abe

(10) Patent No.: US 6,742,702 B2
(45) Date of Patent: Jun. 1, 2004

(54) GAS INJECTION TYPE SOLDERING METHOD AND APPARATUS

(75) Inventor: Shigeru Abe, Tokyo (JP)

(73) Assignee: Japan Unix Co., Ltd., Tokyo (JP)

( * ) Notice: Subject to any disclaimer, the term of this patent is extended or adjusted under 35 U.S.C. 154(b) by 141 days.

(21) Appl. No.: 10/036,400

(22) Filed: Jan. 7, 2002

(65) Prior Publication Data

US 2003/0127498 A1 Jul. 10, 2003

(51) Int. Cl.$^7$ .................. B23K 31/02; B23K 35/38; B23K 1/00; B23K 3/00
(52) U.S. Cl. .................. 228/220; 228/51
(58) Field of Search .................. 228/219, 220, 228/244, 245, 25, 41, 51; 219/137.31, 137.41, 137.42

(56) References Cited

U.S. PATENT DOCUMENTS

| | | | | |
|---|---|---|---|---|
| 3,912,153 A | * | 10/1975 | Hartleroad et al. | 228/254 |
| 4,678,886 A | * | 7/1987 | Kawaguchi | 219/85.1 |
| 4,805,830 A | * | 2/1989 | Kawaguchi | 228/180.5 |
| 4,858,593 A | * | 8/1989 | Hsu | 126/414 |
| 4,937,006 A | * | 6/1990 | Bickford et al. | 228/219 |
| 5,057,969 A | * | 10/1991 | Ameen et al. | 361/720 |
| 6,021,940 A | * | 2/2000 | Sindzingre et al. | 228/203 |
| 6,247,631 B1 | * | 6/2001 | Kawakatsu et al. | 228/51 |
| 6,336,581 B1 | * | 1/2002 | Tuchiya et al. | 228/33 |
| 6,395,972 B1 | * | 5/2002 | Tran et al. | 136/251 |

FOREIGN PATENT DOCUMENTS

| | | | |
|---|---|---|---|
| EP | 1275461 A1 | * | 1/2003 |
| JP | 406170522 A | * | 7/1994 |
| JP | 9-181436 | | 7/1997 |
| JP | 2000-33475 | | 2/2000 |

* cited by examiner

Primary Examiner—Stanley S. Silverman
Assistant Examiner—Colleen P. Cooke
(74) Attorney, Agent, or Firm—Oblon, Spivak, McClelland, Maier & Neustadt, P.C.

(57) ABSTRACT

After a reducing gas is mixed with an inert gas by a mixer, a resultant mixed gas is heated by a heater and made to a hot mixed gas which is dehumidified and dried and the temperature of which is increased. The mixed gas is injected to a subject from an injection port formed in a soldering iron, and thereby soldering is performed by heating and melting solder with the soldering iron in the atmosphere of the mixed gas.

13 Claims, 6 Drawing Sheets

GAS INJECTION TYPE SOLDERING METHOD AND APPARATUS

TECHNICAL FIELD

The present invention relates to a method of and an apparatus for soldering electronic devices such as ICs, LSIs, and the like, and other works using a soldering iron in a gas atmosphere.

RELATED ART

When electronic devices and the like are soldered using a soldering iron, there has been employed a method of performing soldering while injecting an inert gas such as a nitrogen gas of high concentration (at least 99%) to a subject to be soldered. According to this method, soldering of good quality can be performed because the oxidation of solder and the subject is prevented by the inert gas as well as the wettability of a soldering iron tip and the subject to the solder is improved.

In contrast, when it is possible to use a reducing gas such as a hydrogen gas in soldering, soldering of very high quality, which cannot be realized by a conventional method, can be performed. This is because that the soldering can be performed while reducing oxide films formed to the soldering iron tip and the subject by the strong reducing action of the reducing gas.

However, the reducing gas such as the hydrogen gas and the like has not been practically used in soldering in which a soldering iron is used because it is very dangerous and difficult to use the reducing gas due to its explosive reaction with oxygen.

DISCLOSURE OF THE INVENTION

Accordingly, it is a technical subject of the present invention to perform soldering of high quality safely and reliably by using a reducing gas when the soldering is carried out using a soldering iron in a gas atmosphere.

To solve the above problem, according to the present invention, there is provided a gas injection type soldering method which is characterized in that after a reducing gas and an inert gas, which are supplied from gas supply sources separately, are mixed at a predetermined ratio by a mixer, a resultant mixed gas is made to a hot mixed gas by being heated by a heater so that the temperature of the mixed gas is increased and the mixed gas is dried by being dehumidified, the hot mixed gas is injected from an injection port formed in a soldering iron to a subject, and soldering is performed in the atmosphere of the mixed gas while preventing the oxidation of the subject by the inert gas in the mixed gas as well as reducing an oxide film by the reducing gas.

According to the present invention, the reducing gas and the inert gas are injected in a uniformly mixed state, and soldering is performed in the atmosphere of the mixed gas. Since soldering can be performed by reducing an oxide film by the reducing gas while preventing the oxidation of the subject by perfectly shutting off it from oxygen in outside air by the inert gas, very stable soldering of high quality can be performed. Moreover, since no flux is needed, it is not necessary to use expensive thread solder in which flux is sealed and less expensive fluxless solder can be used as well as a job for cleaning remaining flux is not necessary, from which a large economical effect can be obtained. Further, since wettability to lead-free solder containing no lead component is enhanced, it is possible to perform soldering of higher quality using the lead free solder.

Further, even if the mixed gas is injected into outside air from the soldering iron, the reducing gas does not cause an explosive reaction and is safe because the purity of the reducing gas is suppressed to a low level by being mixed with the inert gas as well as the reaction of the reducing gas is suppressed by the inert gas around it and the reducing gas reacts only with the oxide film.

In the present invention, the hot mixed can be injected simultaneously also from a solder guide for feeding thread solder to the soldering iron.

In the present invention, it is preferable that the reducing gas be a hydrogen gas, the inert gas be a nitrogen gas, and the ratio of the hydrogen gas in the mixed gas be 2 to 15%.

According to the present invention for embodying the above method, there is provided a soldering apparatus including a gas injection mechanism for injecting a mixed gas in which a reducing gas is mixed with an inert gas from an injection port to a subject and a soldering iron for performing soldering by heating and melting solder.

The gas injection mechanism includes flow regulators for individually regulating the flow rates of the reducing gas and the inert gas supplied from gas supply sources separately, a gas mixer for uniformly mixing the reducing gas and the inert gas supplied from the flow regulators, a gas heater for heating a mixed gas supplied from the gas mixer so as to dehumidify and dry it and to increase the temperature of the mixed gas, the injection port for injecting the heated hot mixed gas, and a controller capable of regulating the mixing ratio of the reducing gas and the inert gas by controlling the respective flow regulators.

In the present invention, the gas injection mechanism may further include a concentration sensor for measuring the concentration of the gas in the vicinity of the subject and a safety circuit for restricting the supply of at least the reducing gas, when the value of concentration measured by the concentration sensor exceeds a set value, by controlling the flow regulators by the controller. With this arrangement, the diffusing state of the reducing gas in the vicinity of the apparatus can be checked so that countermeasures for safety can be taken before the concentration of the reducing gas reaches a dangerous concentration.

According to a specific embodiment of the present invention, the soldering iron is a contact type soldering iron and includes a soldering iron tip at the extreme end thereof to heat and melt solder as well as the injection port opened so as to surround the soldering iron tip.

According to another specific embodiment of the present invention, the soldering iron is a non-contact type soldering iron and has the injection port at the extreme end of the soldering iron, and soldering is performed by heating and melting solder by the heat of the mixed gas itself injected from the injection port in the atmosphere of the mixed gas.

According to still another specific embodiment of the present invention, the soldering iron is a laser type soldering iron and has the injection port at the extreme end of the soldering iron, and soldering is performed by heating and melting solder by the heat of the mixed gas itself injected from the injection port in the atmosphere of the mixed gas.

DETAILED DESCRIPTION

Figure 1:
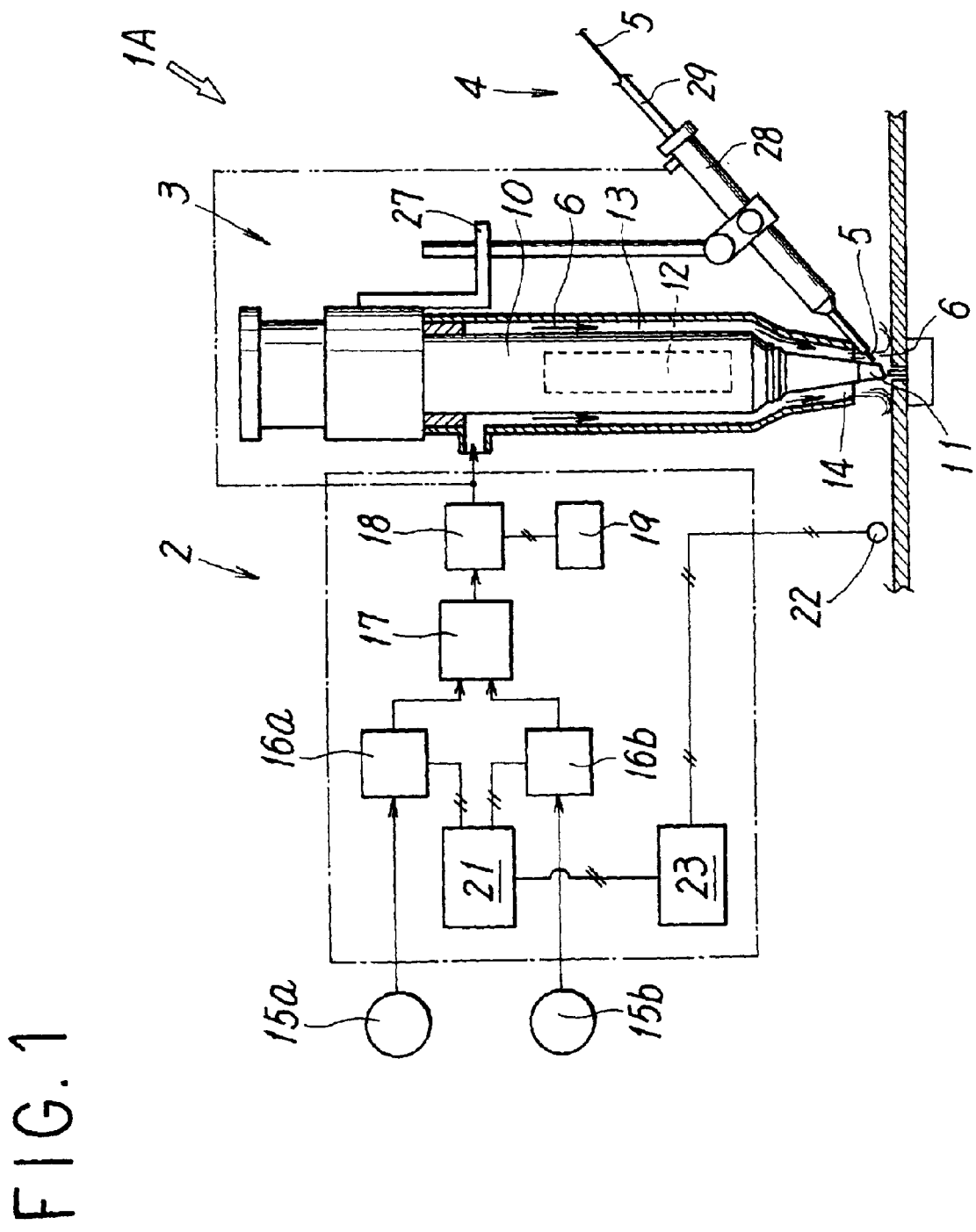
FIG. 1 is a partial sectional view showing a first embodiment of a soldering apparatus according to the present invention.

Preferable embodiments of the present invention will be described below in detail with reference to the drawings. FIG. 1 shows a first embodiment of the present invention. A soldering apparatus 1A shown in the figure includes a gas injection mechanism 2, a soldering iron 3, and a solder feed mechanism 4. The gas injection mechanism 2 injects a mixed gas 6, in which a reducing gas is uniformly mixed with an inert gas at a predetermined ratio, to a subject to be soldered. The soldering iron 3 performs soldering by heating and melting solder in the atmosphere of the mixed gas. The solder feed mechanism 4 feeds thread solder 5 to the soldering iron 3.

The soldering iron 3 is arranged as a contact type and includes a soldering iron main body 10, which contains an electric heat generating type iron heater 12, and a soldering iron tip 11 which projects at the extreme end of the soldering iron main body 10. The soldering iron 3 performs soldering by heating and melting the solder 5 with the soldering iron tip 11 heated by the iron heater and is used by being mounted on an automatic machine such as a soldering robot or the like. In the soldering iron 3, a gas flow path 13, through which the mixed gas flows, is formed around the outer periphery of the soldering iron main body 10, and an injection port 14 communicating with the flow path 13 opens at the extreme end of the soldering iron 3 so as to surround the entire periphery of the soldering iron tip 11. The mixed gas is injected from the injection port 14 in a columnar state, and the entire periphery of the soldering iron tip 11 and the subject are completely covered with the jet stream of the mixed gas in a curtain state. With this operation, the soldering iron tip and the subject can be approximately completely shut off from oxygen in atmosphere.

The gas flow path 13 and the injection port 14 formed in the soldering iron 3 constitute a portion of the gas injection mechanism 2 which is specifically arranged as described below. That is, the gas injection mechanism 2 includes a flow regulators 16a and 16b, a gas mixer 17, and a gas heater 18. The flow regulators 16a and 16b individually regulate the flow rates of the reducing gas and the inert gas supplied from gas supply sources 15a and 15b, respectively. The gas mixer 17 mixes the reducing gas and the inert gas the flow rates of which have been regulated by the flow regulators 16a and 16b, respectively in an approximately uniformly mixed state. The gas heater 18 heats the mixed gas from the gas mixer 17 so that it is dehumidified and dried and the temperature thereof is increased to a predetermined temperature. The gas injection mechanism 2 injects the hot mixed gas, which has been heated by the gas heater 18, to the subject from the gas flow path 13 formed in the soldering iron 3 through the injection port 14. Reference numeral 9 in the figure denotes a temperature regulator for regulating the temperature of the gas heater 18. While the temperature of the mixed gas is set within a range in which the reduction of temperature of the soldering iron tip 11 can be prevented and the subject can be preliminarily heated, the temperature is lower than the temperature of the soldering iron tip which is necessary to perform soldering and is, for example, about 250 to 300° C.

While hydrogen, for example, is preferably used as the reducing gas, and nitrogen, for example, is preferably used as the inert gas, other types of gases may be used. While it is preferable that the ratio of the reducing gas in the mixed gas be 2–15%, other ratio may be employed.

The flow regulators 16a and 16b are connected to a controller 21, respectively. The controller 21 can individually control the flow rates of the reducing gas and the inert gas according to set values, and thereby the mixing ratio of the two types of the gases can be optionally regulated so that an optimum mixing ratio can be obtained in accordance with soldering conditions, a state of the subject, and the like.

The gas injection mechanism 2 further includes a concentration sensor 22 and a safety circuit 23. The concentration sensor 22 measures the concentration of the gas in the vicinity of the soldering subject. The safety circuit 23 controls the supply of the mixed gas by operating the controller 21 in response to a concentration measuring signal from the concentration sensor 22. When a measured concentration value exceeds a set value previously set to the safety circuit 23, the controller 21 controls one or both of the flow regulators 16a and 16b in response to a signal from the safety circuit 23 so that the flow rate of only the reducing gas or both the flow rates of the reducing gas and the inert gas are reduced or the supply thereof is stopped. At the same time, a suitable warning signal may be issued from the safety circuit 23 to a worker.

The solder feed mechanism 4 has a cylindrical solder guide 28 which is supported so as to be free to tilt by the soldering iron 3 through a support arm 27. The solder guide 28 is connected to a not shown solder feed source through a flexible tube 29 and supplies the thread solder 5 fed from the solder feed source to the soldering iron tip 11 from the extreme end of the solder guide 28. It is preferable to dispose a preheater in the inside of the solder guide 28 and to preliminarily heat the thread solder 5 with the heater.

The solder guide 28 also may act as a means for injecting the hot mixed gas. That is, the solder guide 28 may be arranged as described below. That is, a gas flow path may be formed in the inside of the solder guide 28 as well as an injection port may be formed around the solder feed port at the extreme end thereof, the solder guide 28 may be connected to the gas outlet of the heater 18 as shown by a dot-dash line in the figure, and the hot mixed gas heated by the gas heater 18 may be also injected from the solder guide 28 simultaneously.

The soldering apparatus 1A of the first embodiment arranged as described above performs soldering by heating and melting the thread solder 5 with the soldering iron tip 11 in the atmosphere of the mixed gas, which has been obtained by uniformly mixing the reducing gas with the inert gas in the gas injection mechanism 2, while injecting the hot mixed gas to the soldering subject from the injection port 14 through the gas flow path 13 formed in the soldering iron 3. At this time, the oxidation of the soldering subject is prevented by the inert gas as well as the wettability thereof is enhanced, and further an oxide film is reduced by the reducing gas. Accordingly, the solder flows and deposits very well without using flux, and thereby stable soldering of high quality can be performed with a high alloy property.

As a result, thread solder containing flux in an amount of 1% or less or fluxless thread solder containing no flux can be used as the thread solder 5 in place of conventional thread solder containing flux in an amount of 2 to 4%. Thus, there is an advantage that a job for removing remaining flux after soldering can be simplified or becomes unnecessary. The improvement of the wettability permits the use of lead free solder which contains no lead component. Further, the mixed gas can be safely injected into atmosphere from the soldering iron 3 without the occurrence of explosive reaction. The reason is that the purity of the reducing gas is set to a low level because it is mixed with the inert gas and that the reaction of the reducing gas is suppressed by the inert gas therearound and the reducing gas only reacts substantially with the oxide film.

Figure 6:
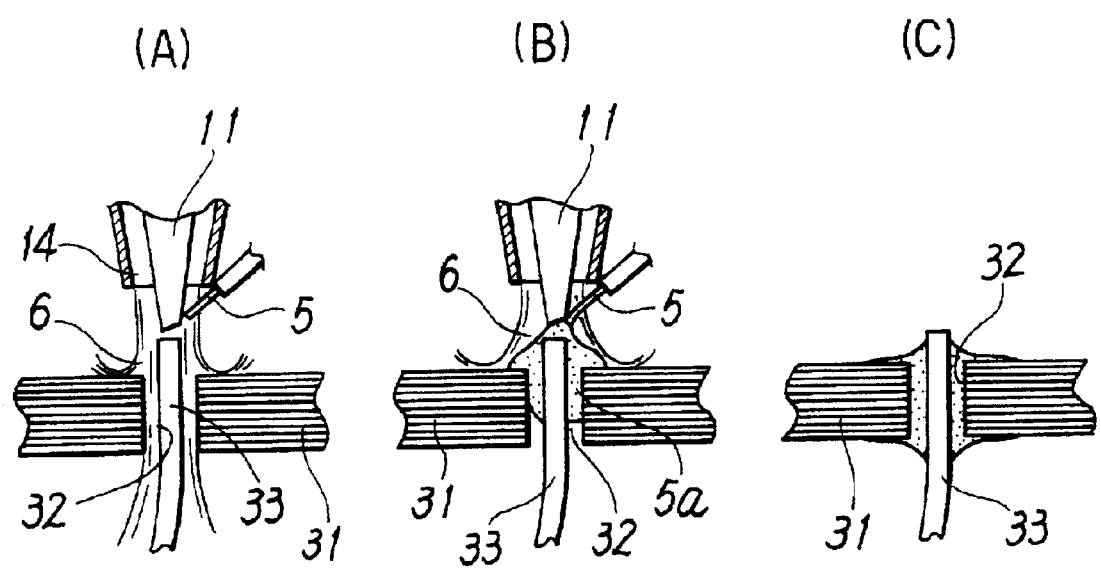
FIGS. 6(A), 6(B), and 6(C) are partial sectional views sequentially explaining soldering steps according to the present invention.

FIGS. 6(A) to 6(C) show a case that a lead pin 33 is inserted into a through hole 32 of a multi-layer substrate 31 such as a mother board used in communication switching equipment and soldered by the soldering apparatus 1A. The multi-layer substrate 31 has 12 to 30 layers and the thickness thereof reaches 4.6 mm when it has 26 layers, and the thickness tends to more increases hereafter.

The lead pin 33 is poorly soldered to the multi-layer substrate 31 in many cases. This is because that the wettability and the flow of melted solder are made bad by the oxide films, which are usually formed on the surface of the lead pin 33, the inner surface of the through hole 32, and the like, and thus the activation of the solder is finished by the evaporation, the carbonization, and the like of flux which occurs before the solder reaches the back surface of the multi-layer substrate 31 through the through hole 32, and thereby the solder is solidified (the state shown in FIG. 6(B)). A satisfactory effect cannot be obtained even if flux is additionally coated previously.

When the soldering apparatus 1A of the first embodiment is used, the surface of the lead pin 33 and the inner surface of the through hole 32 are exposed to the atmosphere of the mixed gas 6 as shown in FIG. 6(A), and the oxidation thereof is prevented by the inert gas as well as the oxide films are reduced by the reducing gas, and thereby the melted solder flows more rapidly and the wettability thereof is enhanced. Accordingly, the melted solder reliably and smoothly passes through the through hole 32 and reaches the back surface of the multi-layer substrate 31 while being supported also by the flow of the mixed gas as shown by FIGS. 6(B) and 6(C), and the lead pin 33 can be perfectly soldered in the entire through hole 32.

Figure 2:
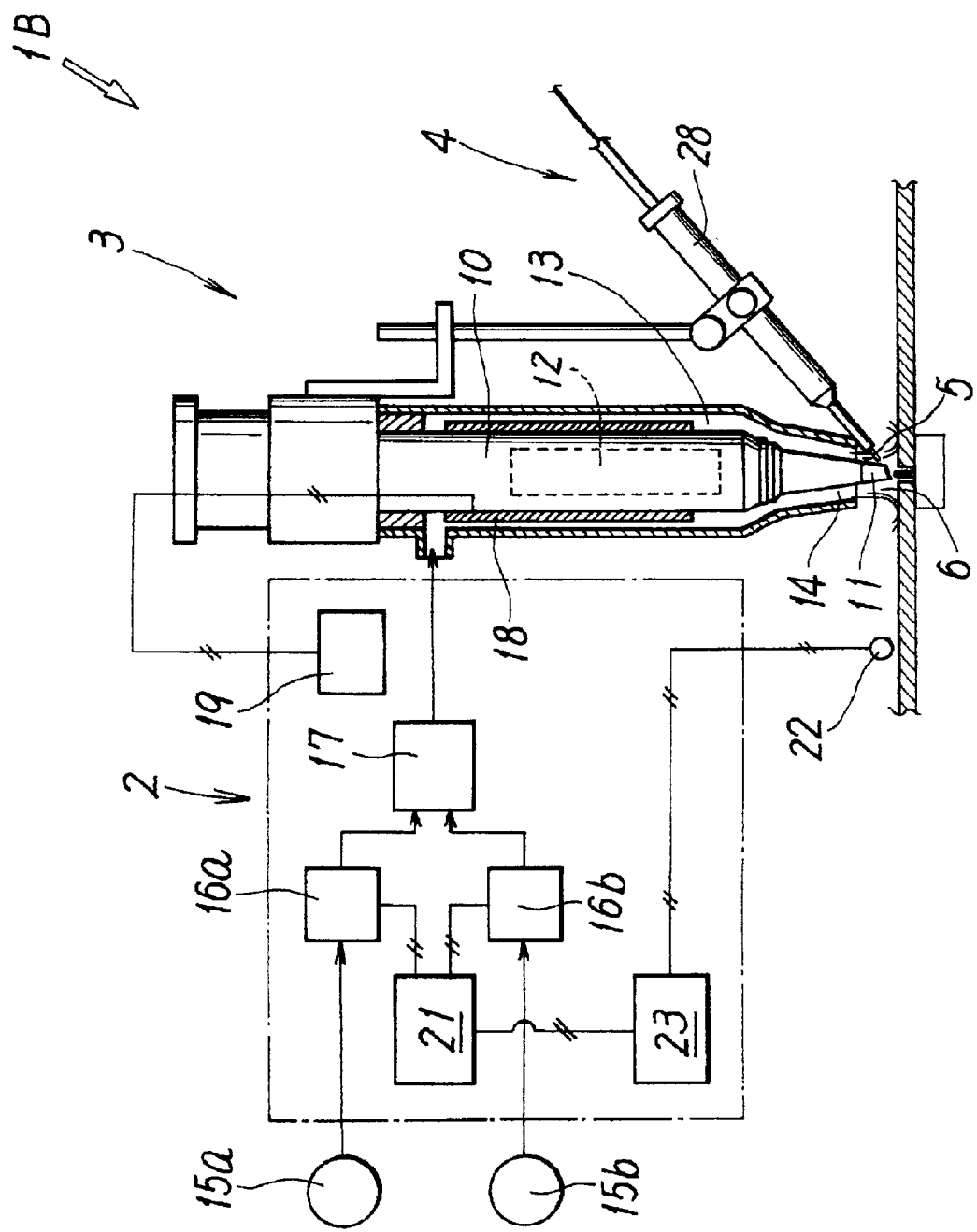
FIG. 2 is a partial sectional view showing a second embodiment of the soldering apparatus according to the present invention.

FIG. 2 shows a second embodiment of the soldering apparatus of the present invention. The soldering apparatus 1B of the second embodiment is different from the first embodiment in that the gas heater 18 for heating the mixed gas is disposed to the outside of the soldering iron 3 in the first embodiment, whereas, a gas heater 18 is disposed to the inside of a soldering iron 3 in the second embodiment. That is, in the second embodiment, the gas heater 18 is disposed in the inside of a gas flow path 13 formed in the soldering iron 3 so as to surround a soldering iron main body 10. A mixed gas is heated in the gas flow path 13.

The arrangement and the operation of the second embodiment other than the above are substantially the same as those of the first embodiment. Thus, the same reference numerals as used in the first embodiment are used in the second embodiment to denote the same typical components, and the description thereof is omitted.

It should be noted that when a solder guide 28 also acts as a means for injecting a mixed gas in the second embodiment, a heater is disposed in the solder guide 28 to heat the mixed gas. In this case, while the gas heater may be provided separately from a solder preheater, the solder preheater may be used also to heat the gas.

Further, the gas heaters 18 may be disposed to both the outside and the inside of the soldering iron 3 in place of that it is disposed to only the outside or the inside of the soldering iron 3. Further, when the gas heater 18 is disposed to the inside of the soldering iron 3, only a single heater may be provided to heat both the gas and solder without providing a gas heater and a solder heater separately.

Figure 3:
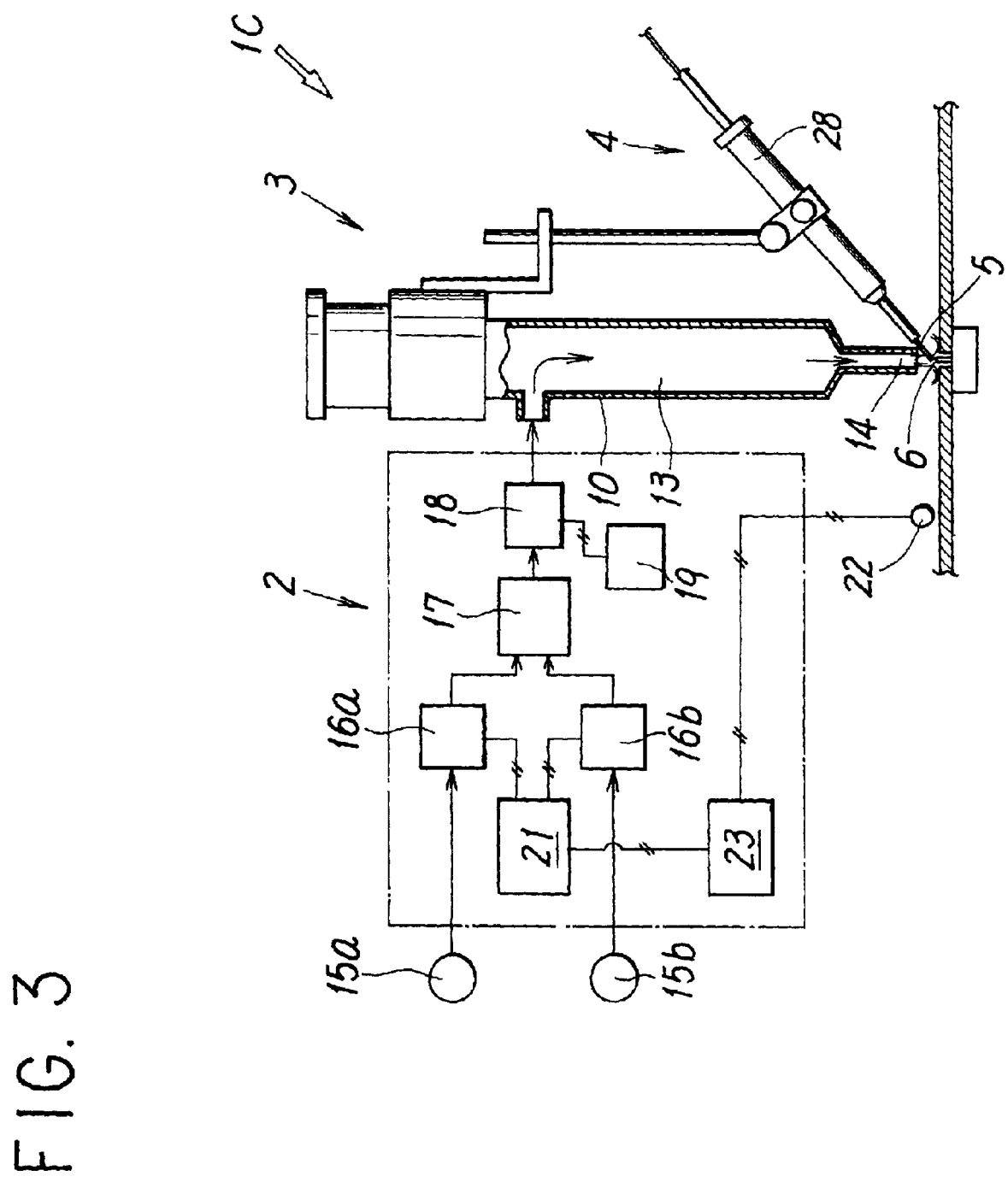
FIG. 3 is a partial sectional view showing a third embodiment of the soldering apparatus according to the present invention.

FIG. 3 shows a third embodiment of the soldering apparatus of the present invention. The soldering apparatus 1C of the third embodiment is different from the first embodiment in that the soldering iron 3 of the first embodiment is of the contact type in which solder is heated and melted with the soldering iron tip 11, whereas, in the third embodiment, a soldering iron 3 is a non-contact type soldering iron. That is, the soldering iron 3 of the third embodiment includes the above injection port 14 having a fine radius at the extreme end of a pipe-shaped soldering iron main body 10 including a gas flow path 13 in the inside thereof. The soldering iron 3 performs soldering by heating and melting solder 5 by the heat of a mixed gas 6 itself, which is injected from the injection port 14, in the atmosphere of the mixed gas 6. Accordingly, the mixed gas 6 is heated by a gas heater 18 to a temperature higher than the melting temperature of thread solder (for example, 250 to 800° C.)

Since the arrangement and the operation of the third embodiment other than the above are substantially the same as those of the first embodiment, the same reference numerals as used in the first embodiment are used in the third embodiment to denote the same typical components, and the description thereof is omitted.

Figure 4:
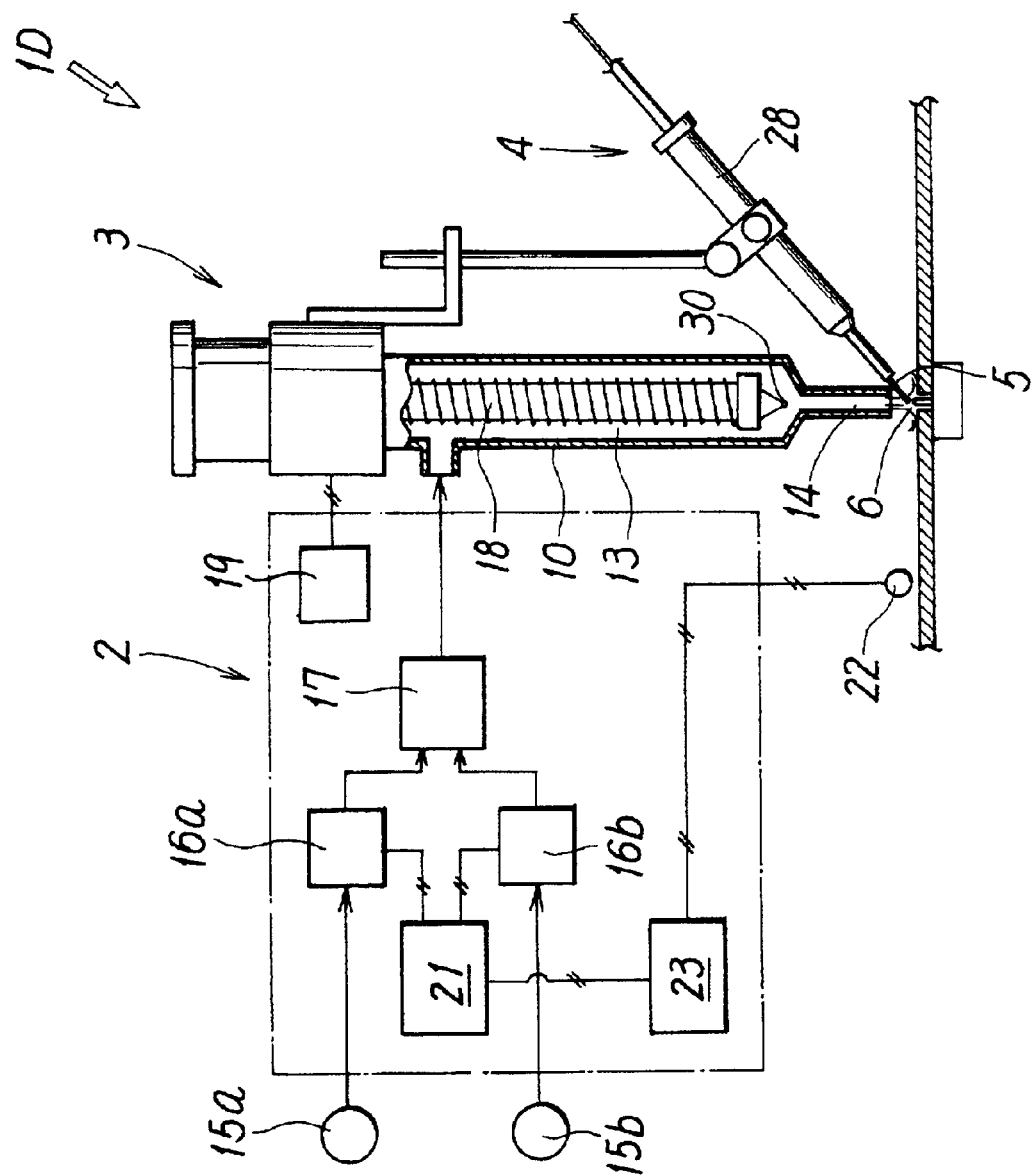
FIG. 4 is a partial sectional view showing a fourth embodiment of the soldering apparatus according to the present invention.

FIG. 4 shows a fourth embodiment of the soldering apparatus of the present invention. The soldering apparatus 1D of the fourth embodiment is different from the third embodiment in that a gas heater 18 for heating a mixed gas is disposed in the inside of a soldering iron main body 10 of a soldering iron 3. In the figure, reference numeral 30 denotes a temperature sensor for measuring the injected temperature of the mixed gas. The arrangement of the fourth embodiment other than the above is substantially the same as that of the third embodiment.

Note that the above gas heater 18 may be disposed to both the outside and the inside of the soldering iron 3.

Figure 5:
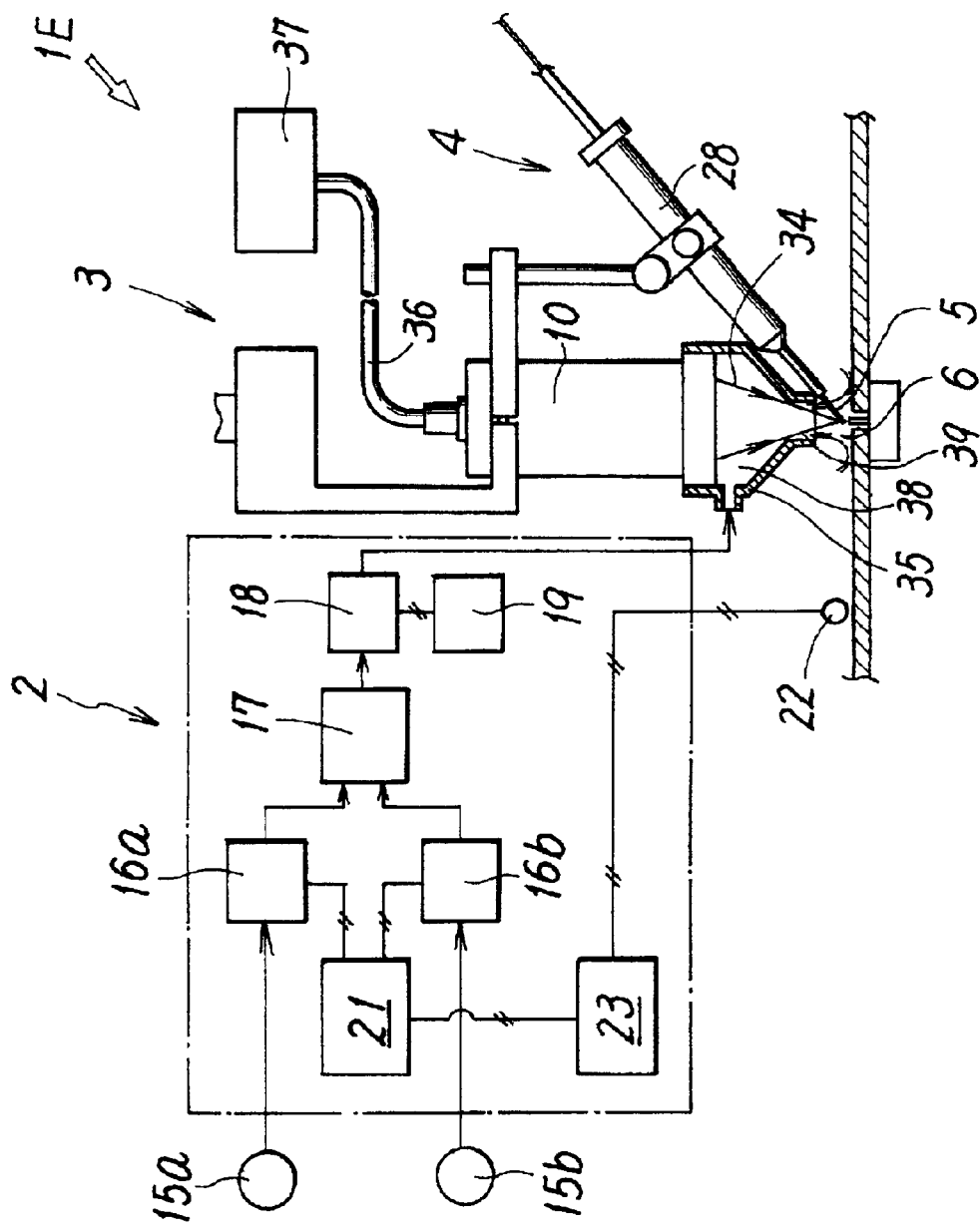
FIG. 5 is a partial sectional view showing a fifth embodiment of the soldering apparatus according to the present invention.

FIG. 5 is shows a fifth embodiment of the soldering apparatus of the present invention. The soldering apparatus 1E of the fifth embodiment is different from the first embodiment in that a soldering iron 3 is a laser type soldering iron. That is, the soldering iron 3 of the fifth embodiment has a soldering iron main body 10, in which a condenser is contained, and a cylindrical tapering-down nozzle portion 35 disposed at the extreme end of the soldering iron main body 10. A laser oscillator 37 is connected to the base end of the soldering iron main body 10 through an optical fiber 36. The space 38 in the inside of the nozzle portion 35 acts as both a light path for a laser beam 34 and a gas flow path as well as the opening 39 at the extreme end of the nozzle portion 35 acts as both a projection port for projecting the laser beam 34 and an injection port for injecting a mixed gas. A flow path from a gas heater 18 in a gas injection mechanism 2 is connected to the connection port on a side of the nozzle portion 35. The mixed gas heated by the gas heater 18 is supplied into the nozzle portion 35.

Then, the hot mixed gas is injected to a subject from the opening 39 at the extreme end of the nozzle portion 35 as well as the laser beam 34 is projected therefrom, and thereby soldering is performed by heating and melting solder 5 by the laser beam 34 in the jet stream of the mixed gas. Since the laser beam 34 is projected in the jet stream of the mixed gas having high temperature, the laser beam 34 is prevented from coming into contact with cold outside air, and thus the temperature thereof is not lowered. Moreover, since respective parts, print boards, and the like as subjects are preheated by the hot mixed gas, soldering can be performed effectively.

Since the arrangement and the operation of the fifth embodiment other than the above are substantially the same as those of the first embodiment, or a preferable modification, and the like of the fifth embodiment are substantially the same as the first embodiment, the same reference numerals as used in the first embodiment are used in the fifth embodiment to denote the same typical components, and the description thereof is omitted.

Further, while the gas heater 18 is disposed to the outside of the soldering iron 3 in the fifth embodiment, a heater may be disposed in the space 38 in the nozzle portion 35 in place of or together with the gas heater 18 disposed to the outside of the soldering iron 3.

Point soldering, in which soldering is performed with the thread solder 5 intermittently fed by the solder feed mechanism 4 to each point of a subject, has been described in the above respective embodiments. However, the present invention also can be applied to draw soldering in which soldering is performed while continuously moving a soldering iron along a subject with thread solder being continuously fed as, for example, in a case in which a plurality of connector pins arranged in a column-shape are continuously soldered. Alternately, the present invention also can be applied to a case in which soldering is performed by melting cream-like solder previously coated to a subject with a soldering iron, in addition to the system in which soldering is performed while feeding thread solder by the solder feed mechanism as described above. In this case, it is needless to say that the point soldering and the draw soldering as described above can be performed. When the cream-like solder is used, it is not necessary to provide the solder feed mechanism.

Further, while the soldering iron 3 is used by being mounted on an automatic machine such as a robot in the above respective embodiments, the soldering iron 3 may be a hand-operated type soldering iron that is operated manually. When the solder feed mechanism is provided with the hand-operated type soldering iron, a solder guide may be mounted on the soldering iron as shown in the above respective embodiments. However, thread solder may be held by a hand opposite to a hand for operating the soldering iron and fed by the hand without providing the solder feed mechanism with the soldering iron.

As described above, according to the present invention, soldering is performed while injecting a mixed gas obtained by mixing a reducing gas with an inert gas to a subject from the injection port formed in the soldering iron. Accordingly, stable soldering of high quality can be performed safely and reliably while effectively utilizing the oxidation preventing function of the inert gas and the oxide film reducing function of the reducing gas as well as suppressing the abrupt reaction of the reducing gas with oxygen in outside air by the inert gas.

What is claimed is:

1. A gas injection type soldering apparatus, comprising:
   a gas injection mechanism configured to inject a mixed gas in which a reducing gas is mixed with an inert gas from an injection port to a subject; and
   a soldering iron configured to perform soldering by heating and melting solder, the soldering iron including the injection port,
   wherein the gas injection mechanism comprises flow regulators configured to individually regulate flow rates of the reducing gas and the inert gas supplied from gas supply sources separately, a gas mixer configured to uniformly mix the reducing gas and the inert gas supplied from the flow regulators, a gas heater configured to heat the mixed gas supplied from the gas mixer to dehumidify and dry the mixed gas and to increase a temperature of the mixed gas, the injection port configured to inject the heated hot mixed gas, and a controller configured to regulate a mixing ratio of the reducing gas and the inert gas by controlling the respective flow regulators.

2. A soldering apparatus according to claim 1, wherein the gas injection mechanism further comprises a concentration sensor configured to measure a concentration of the gas in the a vicinity of the subject and a safety circuit configured to restrict a supply of at least the reducing gas, when a value of concentration measured by the concentration sensor exceeds a set value, by controlling the flow regulators by the controller.

3. A soldering apparatus according to claim 1, wherein the reducing gas is a hydrogen gas and the inert gas is a nitrogen gas.

4. A soldering apparatus according to claim 1, further comprising:
   a guide configured to feed thread solder to the soldering iron, the guide configured to inject the hot mixed gas.

5. A soldering apparatus according to claim 1, wherein the soldering iron is a contact type soldering iron comprising a soldering iron main body in which a soldering iron heater is contained, a soldering iron tip configured to heat and melt solder, the injection port opened so as to surround an entire periphery of the soldering iron tip, and a gas flow path communicating with the injection port.

6. A soldering apparatus according to claim 5, wherein the temperature of the mixed gas is set to a temperature lower than a temperature of the soldering iron tip when soldering is performed.

7. A soldering apparatus according to claim 1, wherein the soldering iron is a non-contact type soldering iron and has the injection port at an extreme end of the soldering iron, and soldering is performed by heating and melting solder by heat of the mixed gas itself injected from the injection port in an atmosphere of the mixed gas.

8. A soldering apparatus according to claim 1, wherein the soldering iron is a laser type soldering iron comprising a soldering iron main body configured to project a laser beam and the injection port comprising a projection port of the laser beam, and wherein soldering is performed by projecting the laser beam to the subject in a jet stream of the mixed gas injected from the projection port.

9. A gas injection type soldering apparatus, comprising:
   a gas injection mechanism configured to inject a mixed gas in which a hydrogen gas is mixed with a nitrogen gas from an injection port to a subject; and
   a soldering iron configured to perform soldering by heating and melting solder, the soldering iron including the injection port,
   wherein the gas injection mechanism comprises flow regulators configured to individually regulate flow rates of the hydrogen gas and the nitrogen gas supplied from gas supply sources separately, a gas mixer configured to uniformly mix the hydrogen gas and the nitrogen gas supplied from the flow regulators, a gas heater configured to heat the mixed gas supplied from the gas mixer to dehumidify and dry the mixed gas and to increase a temperature of the mixed gas, the injection port configured to inject the heated hot mixed gas, and a controller configured to regulate a mixing ratio of the hydrogen gas and the nitrogen gas by controlling the respective flow regulators, and further comprising a concentration sensor configured to measure a concentration of the gas in a vicinity of the subject, and a safety circuit configured to restrict a supply of at least the hydrogen gas, when a value of concentration measured by the concentration sensor exceeds a set value, by controlling the flow regulators by the controller.

10. A soldering apparatus according to claim 9, further comprising:

a solder guide configured to feed thread solder to the soldering iron, the solder guide configured to inject the hot mixed gas.

11. A gas injection type soldering apparatus according to claim 9, wherein the soldering iron is a contact type soldering iron comprising a soldering iron main body in which a soldering iron heater is contained, a soldering iron tip configured to heat and melt solder, the injection port opened so as to surround an entire periphery of the soldering iron tip, and a gas flow path communicating with the injection port, and wherein the temperature of the mixed gas is set to a temperature lower than a temperature of the soldering iron tip when soldering is performed.

12. A soldering apparatus according to claim 9, wherein the soldering iron is a non-contact type soldering iron and has the injection port at an extreme end of the soldering iron, and soldering is performed by heating and melting solder by heat of the mixed gas itself injected from the injection port in an atmosphere of the mixed gas.

13. A gas injection type soldering apparatus according to claim 9, wherein the soldering iron is a laser type soldering iron comprising a soldering iron main body configured to project a laser beam and the injection port comprising a projection port of the laser beam, and wherein soldering is performed by projecting the laser beam to the subject in a jet stream of the mixed gas injected from the projection port.

* * * * *